United States Patent [19]

Jürgensen

[11] Patent Number: 5,162,256
[45] Date of Patent: Nov. 10, 1992

[54] PROCESS FOR PRODUCING DOPED SEMICONDUCTOR LAYERS

[75] Inventor: Holger Jürgensen, Aachen, Fed. Rep. of Germany

[73] Assignee: Aixtron GmbH, Fed. Rep. of Germany

[21] Appl. No.: 646,794

[22] PCT Filed: Jun. 2, 1990

[86] PCT No.: PCT/DE90/00425
§ 371 Date: Jan. 31, 1991
§ 102(e) Date: Jan. 31, 1991

[87] PCT Pub. No.: WO90/15435
PCT Pub. Date: Dec. 13, 1990

[30] Foreign Application Priority Data

Jun. 2, 1989 [DE] Fed. Rep. of Germany ....... 3918094

[51] Int. Cl.$^5$ .............................. H01L 21/20
[52] U.S. Cl. ...................... 437/110; 437/82; 437/108; 437/139; 437/247; 148/DIG. 37
[58] Field of Search .............. 437/110, 111, 108, 139, 437/987, 82, 247; 148/DIG. 37

[56] References Cited

U.S. PATENT DOCUMENTS

| | | | |
|---|---|---|---|
| 4,404,421 | 9/1983 | Fraas | 437/110 |
| 4,566,918 | 1/1986 | Irvine et al. | 437/987 |
| 4,571,275 | 2/1986 | Moitsvold | 148/DIG. 37 |
| 4,859,627 | 8/1989 | Sunakawa | 437/111 |
| 4,960,728 | 10/1990 | Schaake et al. | 437/987 |

FOREIGN PATENT DOCUMENTS 8103399 11/1931 World Int. Prop. O. .

OTHER PUBLICATIONS

E. F. Schubert et al. "Diffusion of Atomic Silicon in Gallrium Arsenide", Applied Physics Letters, vol. 53 No. 4 Jul. 25, 1988 American Institute of Physics New York, N.Y. pp. 293–295.

Primary Examiner—Brian E. Hearn
Assistant Examiner—Kevin Picardat
Attorney, Agent, or Firm—Evenson, Wands, Edwards, Lenahan & McKeown

[57] ABSTRACT

A multiplicity of thin layers are applied on top of each other having alternately comparatively high concentrations of charge carriers and no doping. The thickness and the concentration of charge carriers of the individual layers being are proportioned in such a manner that the desired low concentration of charge carriers is yielded by averaging the multiplicity of layers.

20 Claims, 1 Drawing Sheet

PROCESS FOR PRODUCING DOPED SEMICONDUCTOR LAYERS

FIELD OF THE INVENTION The present invention relates to a process for producing doped semiconductor layers having a low concentration of charge carriers.

BACKGROUND OF THE INVENTION

The concentration of n-, respectively, p-charge carriers in semiconductor materials is set by incorporating corresponding doping material elements into the basic crystal lattice. In the conventional processes for fabricating doped semiconductor layers, by way of illustration, VPE, MOCVD, LPE or MBE processes, the concentration of doping material elements in the vicinity of the substrate, on which the layers are produced, is maintained as constant as possible. The doping material element or elements are usually offered in the form of gases, fluids or molecular rays.

In this manner, the constant concentration of doping material elements is set in the solid, i.e. in the produced layer, via the distribution coefficient between the surrounding medium and the solid, thereby setting a constant concentration of charge carriers.

By way of illustration, in order to produce GAInAs layers having a concentration of $10^{16}$ zinc atoms per $cm^3$, a partial pressure of the zinc compound of approx. $10^{-9}$ bar is needed. On the other hand, setting a doping material concentration of $10^{15} cm^{-3}$ requires setting the partial pressure of zinc compounds at a value of less than $10^{-10}$ bar.

As in the conventional processes for producing doped semiconductor layers, the partial pressure of doping material compounds has to be kept constant during the entire production of the layers, producing layers having a low concentration of charge carriers, respectively in the range of $10^{15} cm^{-3}$, is technically very elaborate and demanding without any ensurance of actually having set the desired concentration of charge carriers with the necessary precision.

The object of the present invention is to provide a process for producing doped semiconductor layers having a low concentration of charge carriers, which permits producing low concentrations of charge carriers, typically in the range of less than $10^{16} cm^{-3}$, with the effort and expense therefor being justifiable.

SUMMARY OF THE INVENTION

The present invention is based on the fundamental concept that setting the desired concentration of charge carriers occurs not by a constant supply of doping material elements during the production of the layers, but rather by a sequence of typically rectangular doping material profiles and establishing an average via the doping material profiles.

For this purpose, the desired layer having a predetermined low concentration of charge carriers is produced by being built up of a multiplicity of substantially thinner layers, which are applied on top of each other and alternately have a relatively high concentration of doping material, and thus a relatively high concentration of charge carriers, and no doping. The thickness and the concentration of charge carriers of the individual layers are calculated in such a manner that averaging "perpendicular to the surface of the layers" over a multiplicity of layers yields the desired low concentration of charge carriers.

The term "no doping" means the areas, which may very well have a very small concentration of doping material elements, by way of illustration, as a result of residues in the reaction vessel due to the production of "the layer lying underneath". Decisive is only that the doping in these areas is small compared with the doping of the intended doped layers and also compared to the desired concentration of charge carriers so that an exact setting of in these areas is not "crucial".

The invented process thus has the advantage that it is not necessary to set the low partial pressures of the doping material carrier compounds required for producing a low concentration of doping material with the necessary precision. Rather all that is needed is to set the partial pressure of the elements "supplied" for the doping exactly in a relatively high pressure range in the thin layers having a comparatively high concentration of charge carriers, respectively doping material.

Namely, in electric measuring the high and low doped ranges are averaged so that a mean value is measured as long as the thickness of the individual areas, respectively layers is selected low enough. By way of illustration, macroscopically a layer is yielded having a doping of $10^{15} cm^{-3}$ if 90% of the layer is not doped and 10% of the layer thickness has a doping of $10^{16} cm^{-3}$. Accordingly, it would also be possible not to dope 99% of the layer thickness and to provide 1% of the layer thickness with a doping of $10^{17} cm^{-3}$.

In any case, however, it is necessary to place the doped area uniformly in the overall layer.

Preferred processes suited for the production of the invented layer build-up include MOCVD, VPE, LPE or MBE. It is, however, explicitly pointed out that the list given above is not final.

A range of thickness of the not doped layers to layer thickness of the doped layers is also described. If the layer thickness of not doped layers is larger by the factor 10 to 100 than the layer thickness of the layer thickness of the doped layers, it is ensured that the partial pressure of the doped material carrier also lies in a technically controllable area in the event of very low concentrations of charge carriers as in that case the doped layers have a "doping" that is higher by this factor.

A preferred layer thickness of the doped layers is between one "mono-layer" and approximately 100nm. Maintaining this layer thickness, ensures that the thickness of not-doped layers is "not so great" that it would exclude averaging all the layers in the direction of the thickness of the layer so that the overall layer is represented "macroscopically" as if it had a uniform, low concentration of charge carriers.

According to a further embodiment hereto the multiplicity of layers undergo a thermal treatment following the production. Due to the different diffusion behavior of the doped material, if need be, an improvement in the uniformity may be achieved in the various processes by after-tempering.

The invented processes is suited for producing lower concentrations of charge carriers in any semiconductor materials, by way of illustration in semiconductors on Si or Ge basis or in II-VI-semiconductors. However, the invented process is particularly preferred for use in producing concentrations of charge carriers of less than $10^{16} cm^{-3}$ in the case of III-V- semiconductors.

The present invention is described in the following section using preferred embodiments with reference to the drawing, to which explicit reference is made for the disclosure of all the invented details not made more apparent in the text, by way of example without the intention of limiting the spirit and scope of the overall inventive concept. Shown are in:

DETAILED DESCRIPTION OF THE DRAWINGS

Figure 1:
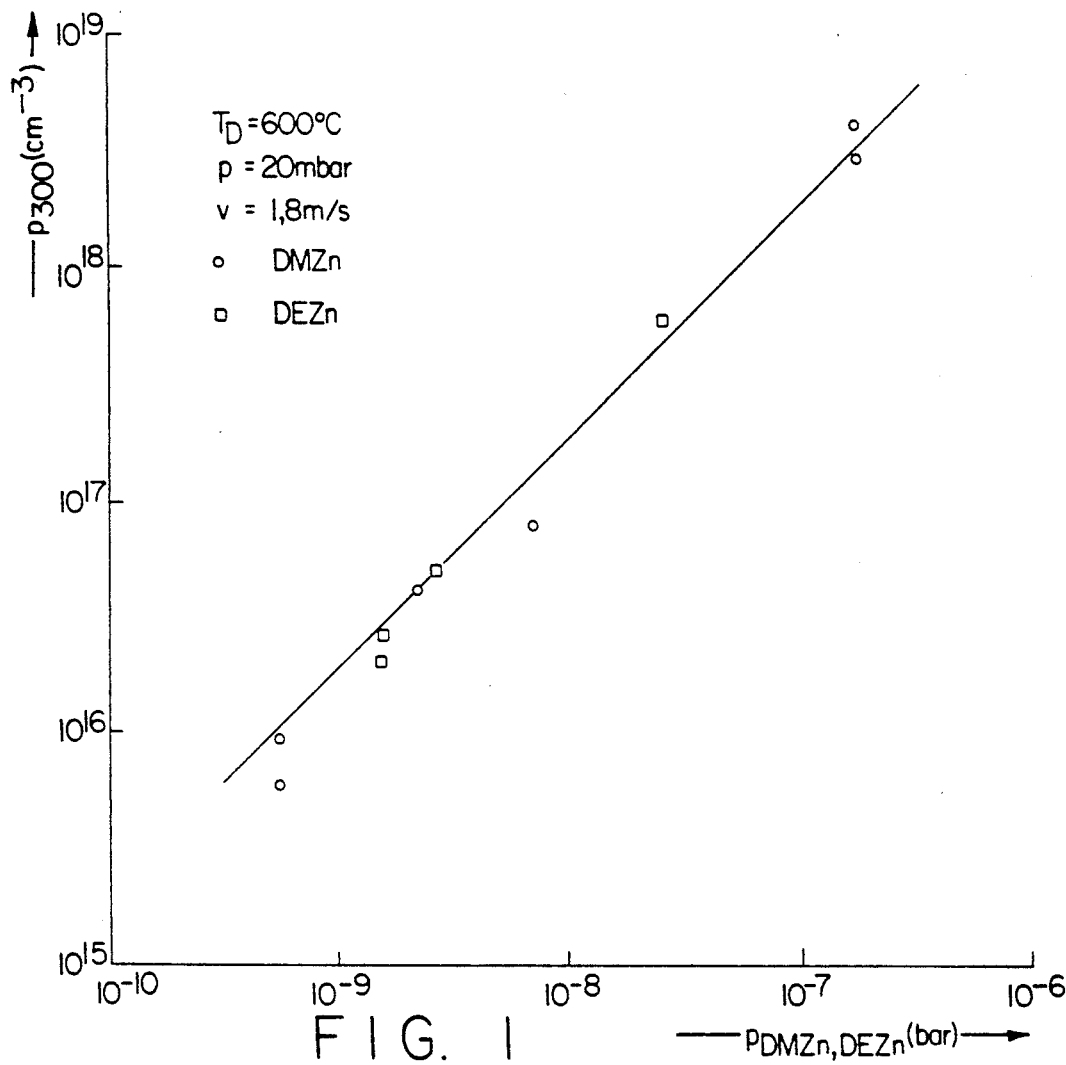
FIG. 1 is a graph of the concentration of doping material as a function of the partial pressure during the production of the layers.

FIG. 1 depicts the concentration of the doping material (applied on the ordinate in atoms/cm$^3$) as a function of the partial pressure of the doping-material carrier (applied on the abcissa in bar), by way of example for incorporating zinc of DMZn or DMZn compounds in GaInAs. The process parameters are given in FIG. 1. p = 20 mbar stands for the overall pressure in the process chamber.

FIG. 1 shows that for the production of very low concentrations of doping material of less than $10^{16}$cm$^{-3}$ very low partial pressures in the range of less than $10^{-9}$ have to be set. Setting and maintaining the partial pressures that low is technically very complicated and expensive and can in practice often not be realized.

For this reason, the desired low concentration of charge carrier of, by way of illustration, $10^{15}$cm$^{-3}$ is set in accordance with the present invention by subsequently applying a multiplicity of thin layers having comparatively high concentrations of charge carriers and no doping.

Figure 2:
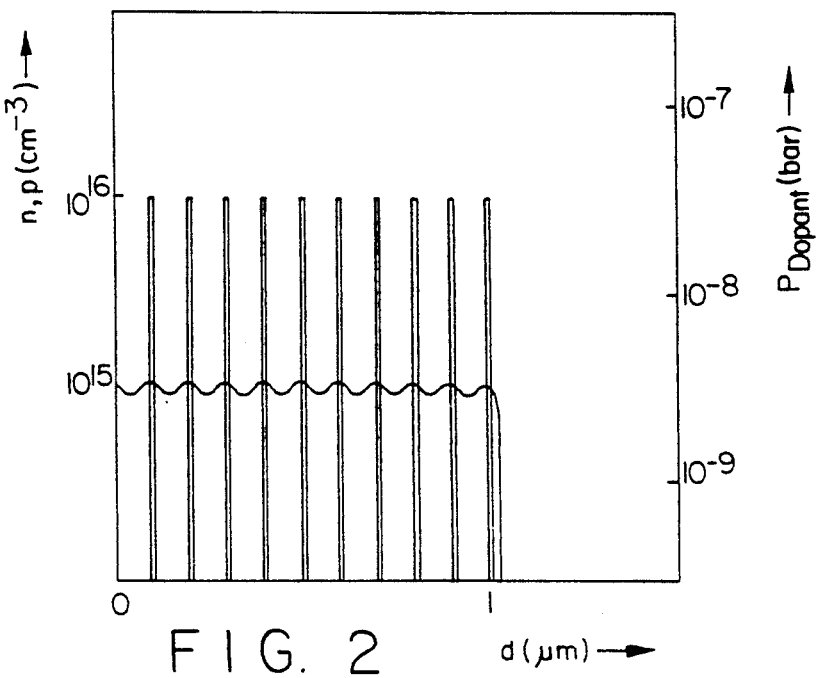
FIG. 2 is a schematic representation of the layer build-up

FIG. 2 depicts schematically the build-up of a layer having a thickness of 1, and having a "mean" concentration of charge carriers of $10^{15}$cm$^{-3}$ the layer is composed perpendicular to the surface of the layer of a multiplicity of substantially thinner layers, of which every second layer has a concentration of charge carriers of about $10^{16}$ cm$^{-3}$. These doped layers are separated from each other by layers without doping, which are thicker by the factor 10. All told this "layer laminate" presents itself macroscopically in such a manner as if it were a "largely uniform" layer having a concentration of charge carriers of about $10^{15}$ cm$^{-3}$. The partial pressures required for the respective layers are given on the right ordinate in FIG. 2: for producing the thin "intermediate" layers having a concentration of charge carriers of $10^{16}$cm$^{-3}$, the partial pressure of doping material carrier compounds may be larger at least by the factor 10 than as would be necessary for the production of a uniform layer having a concentration of charge carriers of $10^{15}$cm$^{-3}$. Thus setting the pressure and maintaining the pressure constant is correspondingly simpler.

The present invention has been described using a preferred embodiment without the intention of limiting the scope and spirit of the overall inventive concept. In particular, the invented processes may also be employed for other doping processes, respectively layer producing processes, doping materials and base materials, such as semiconductors on a silicon base or germanium base or for II-VI-semiconductors.

The concentration of charge carriers, which is to be considered as low in the sense of the present invention, is also dependent on the base material used. Furthermore, the doping concentration of the so-called high-doped layers depends on the respective production process employed and the respective exchange coefficients.

What is claimed is:

1. A process for producing a doped semiconductor layer having a desired low concentration of charge carriers, the process comprising the steps of:
    forming a layer laminate which simulates the doped semiconductor layer having the low concentration of charge carriers, said forming layer including the steps of:
        applying on top of each other a multiplicity of thin layers;
        alternately doping individual layers of said multiplicity of thin layers to have comparatively high concentration of charge carrier layers and no doping layers, respectively;
        proportioning a layer thickness and concentration of charge carriers of the individual layers in such a manner so as to yield said desired low concentration of charge carrier layers by averaging said multiplicity of thin layers.

2. A process according to claim 1, wherein the steps of applying and alternating are carried out using at least one of MOCVD, VPE, LPE and MBE processing techniques.

3. A process according to claim 1, wherein said proportioning step includes the step of providing the layer thickness of non-doped layers greater by a factor of 10 to 100 than the layer thickness of the comparatively high concentration of charge carrier layers.

4. A process according to claim 2, wherein said proportioning step includes the step of providing the layer thickness of non-doped layers greater by a factor of 10 to 100 than the layer thickness of the comparatively high concentration of charge carrier layers.

5. A process according to claim 1, wherein the layer thickness of the comparatively high concentration of charge carrier layers is between one mono-layer and approximately 100 nm.

6. A process according to claim 2, wherein the layer thickness of the comparatively high concentration of charge carrier layers is between one mono-layer and approximately 100 nm.

7. A process according to claim 3, wherein the layer thickness of the comparatively high concentration of charge carrier layers is between one mono-layer and approximately 100 nm.

8. A process according to claim 1, further comprising the step of:
    thermally treating said multiplicity of thin layers following production of the doped semiconductor layers.

9. A process according to claim 2, further comprising the step of:
    thermally treating said multiplicity of thin layers following production of the doped semiconductor layers.

10. A process according to claim 3, further comprising the step of:
    thermally treating said multiplicity of thin layers following production of the doped semiconductor layers.

11. A process according to claim 5, further comprising the step of:

thermally treating said multiplicity of thin layers following production of the doped semiconductor layers.

12. A process according to claim 1, wherein said doped semiconductor layers include a base material and further comprising the step of forming the base material from a III-V semiconductor and yielding said desired low concentration of charge carriers to be $<10^{16}cm^{-3}$.

13. A process according to claim 2, wherein said doped semiconductor layers include a base material and further comprising the step of forming the base material from a III-V semiconductor and yielding said desired low concentration of charge carriers to be $<10^{16}cm^{-3}$.

14. A process according to claim 3, wherein said doped semiconductor layers include a base material and further comprising the step of forming the base material from a III-V semiconductor and yielding said desired low concentration of charge carriers to be $<10^{16}cm^{3-3}$.

15. A process according to claim 5, wherein said doped semiconductor layers include a base material and further comprising the step of forming the base material from a III-V semiconductor and yielding said desired low concentration of charge carriers to be $<10^{16}cm^{3}$.

16. A process according to claim 1, wherein the concentration of charge carriers in the comparatively high concentration layers is larger by a factor of 10 to 100 than said desired low concentration of charge carriers.

17. A process according to claim 2, wherein the concentration of charge carriers in the comparatively high concentration layers is larger by a factor of 10 to 100 than said desired low concentration of charge carriers.

18. A process according to claim 3, wherein the concentration of charge carriers in the comparatively high concentration layers is larger by a factor of 10 to 100 than said desired low concentration of charge carriers.

19. A process according to claim 5, wherein the concentration of charge carriers in the comparatively high concentration layers is larger by a factor of 10 to 100 than said desired low concentration of charge carriers.

20. A process according to claim 8, wherein the concentration of charge carriers in the comparatively high concentration layers is larger by a factor of 10 to 100 than said desired low concentration of charge carriers.

* * * * *